United States Patent [19]
DeTar

[11] Patent Number: 6,077,791
[45] Date of Patent: Jun. 20, 2000

[54] METHOD OF FORMING PASSIVATION LAYERS USING DEUTERIUM CONTAINING REACTION GASES

[75] Inventor: Mark A. DeTar, Round Rock, Tex.

[73] Assignee: Motorola Inc., Schaumburg, Ill.

[21] Appl. No.: 09/038,466

[22] Filed: Mar. 11, 1998

Related U.S. Application Data

[63] Continuation-in-part of application No. 08/771,352, Dec. 16, 1996.

[51] Int. Cl.$^7$ .................................................. H01L 21/31
[52] U.S. Cl. ........................... 438/778; 438/787; 438/791
[58] Field of Search .............................. 438/38, 778, 783, 438/784, 787, 791

[56] References Cited

U.S. PATENT DOCUMENTS

| | | | |
|---|---|---|---|
| 4,597,165 | 7/1986 | Capasso et al. | 29/576 |
| 5,248,348 | 9/1993 | Miyachi et al. | 136/258 |
| 5,571,749 | 11/1996 | Matsuda et al. | 437/113 |
| 5,711,998 | 1/1998 | Shufflebotham | 438/162 |
| 5,872,387 | 2/1999 | Lyding et al. | 257/607 |

FOREIGN PATENT DOCUMENTS

WO 94/19829   9/1994   WIPO .

OTHER PUBLICATIONS

S. M. Sze, VLSI Technology, second edition, p. 63, 1988.
L.S.Shidhu et al., "Deuterium Incorporation Into Glow–Discharge Deposited . . . ",Mat.Res.Soc. Symp.Proc. vol. 377 1995 Mat.Res.Soc., pp. 87–93.
Hisashi Fukuda et al, "Effect of Deuterium Anneal on SiO2/Si(100) Interface Traps . . . ", Control of Semiconducdtor Interfaces, 1994 Elsevier Science B.V., pp. 211–216.
J.F.Conley et al., "Radiation Induced Interface States and ESR Evidence . . . ", 1993 Elsevier Science Publishers B.V., pp. 215–218.
Hisashi Fukuda et al, "Effect of Deuterium Anneal on SiO2/Si(100) . . . ", Jpn. J. Appl. Phys. vol. 32 (1993), Part 2, No. 4B, Apr. 15, 1993, pp. L569–L571.
Wolf, Stanley, Silicon Processing for the VSLI Era, 1990, vol. 2, pp. 188, 196–199.
R.W.Pryor, "Isotope Effects in MNOS Transistors", IEEE Electron Device Letters, vol. EDL–6, No. 1, Jan. 1985, pp. 31–32.
Masahiko Maeda et al., "Infrared spectroscopic study of hydrogenated and deuterated silicon . . . ", J. Appl. Phys. 55(8), Apr. 15, 1984 American Institute of Physics, pp. 3068–3071.
Hawley's Condensed Chemical Dictionary, 1981, 12th Edition, p. 357.

*Primary Examiner*—Charles Bowers
*Assistant Examiner*—Evan Pert
*Attorney, Agent, or Firm*—Robert A. Rodriguez; George R. Meyer

[57] ABSTRACT

Deuterated compounds are used to form passivation (20) and other insulating layers to reduce the hydrogen content within those films. Semiconductor source gases, nitride source gases, and dopant gases can be obtained in deuterated form. Process steps for forming and etching are substantially the same as those used to form and etch conventional insulating layer. A sintering step can be performed using deuterated gas or omitted altogether.

18 Claims, 2 Drawing Sheets

METHOD OF FORMING PASSIVATION LAYERS USING DEUTERIUM CONTAINING REACTION GASES

RELATED APPLICATIONS

This is a continuation-in-part of U.S. patent application Ser. No. 08/771,352 filed Dec. 16, 1996, which is assigned to the current assignee hereof.

FIELD OF THE INVENTION

The present invention relates generally to processes for forming semiconductor devices, and more particularly, to processes for forming insulating layers within those semiconductor devices.

BACKGROUND OF THE INVENTION

Many insulating layers that are formed within semiconductor devices use sources that have hydrogenated gases. Some of these gases include fully hydrogenated silane ($SiH_4$), fully hydrogenated tetraethyl orthosilicate (TEOS), fully hydrogenated ammonia ($NH_3$), fully hydrogenated phosphine ($PH_3$) or fully hydrogenated diborane ($B_2H_6$). The use of these hydrogenated gases can cause problems, such as threshold voltage instability within a device and other problems that are documented in the prior art.

A need exists to reduce the content of hydrogen within insulating layers of semiconductor devices. A need further exists to use other compounds that do not significantly add to the cost or complexity of forming those semiconductor devices.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures are exaggerated relative to other elements to help to improve understanding of embodiment(s) of the present invention.

DETAILED DESCRIPTION

Deuterated compounds are used to form passivation and other insulating layers to reduce the hydrogen content within those films. Semiconductor source gases, nitride source gases, and dopant gases can be obtained in deuterated form. Process steps for forming and etching an insulating layer with deuterated source gases are substantially the same as those used to form and etch a conventional insulating layer with fully hydrogenated source gases. A sintering step can be performed using a deuterated gas or omitting the sintering step altogether. The process reduces the hydrogen content within finished semiconductor devices.

Figure 1:
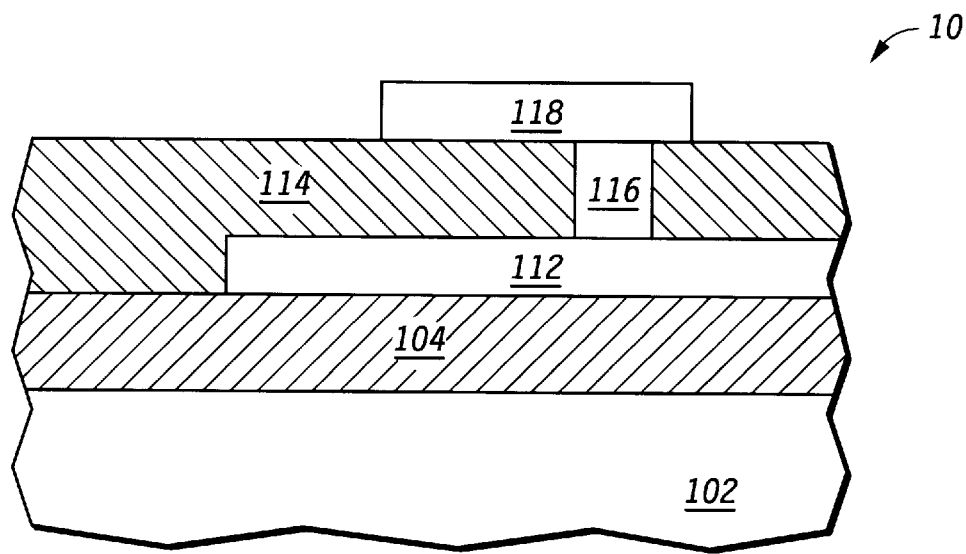
FIG. 1 includes an illustration of a cross-sectional view of a portion of a semiconductor device including two interconnect layers and two insulating layers.

FIG. 1 includes a cross-sectional view of a semiconductor device 10 after forming two interconnect layers and two insulating layers. More specifically, the semiconductor device 10 includes a semiconductor device substrate 102, a first insulating layer 104, a first interconnect layer 112, a second insulating layer 114, a conductive plug 116, and a second interconnect layer 118. As used in this specification, the semiconductor device substrate includes a monocrystalline semiconductor wafer, semiconductor-on-insulator wafer, or other substrates used for semiconductor devices. Electrical components can be formed within the semiconductor device substrate 102 and include transistors, diodes, resistors, capacitors, or the like but are not shown in FIG. 1.

The first insulating layer 104 and second insulating layer 114 include an oxide layer, a nitride layer, or the like. The layers 104 and 114 may be doped or undoped. The first interconnect layer 112 and second interconnect layer 118 includes a conductive film, such as aluminum, copper and the like, and may have an adhesion or a diffusion barrier film beneath the conductive film or an antireflective coating overlying the conductive film. Adhesion films, diffusion barrier films, or antireflective coatings include titanium, tantalum, titanium nitride, tantalum nitride, or the like. The conductive plug 116 includes polysilicon, aluminum, copper, tungsten, or the like. The conductive plug 116 typically includes adhesion and diffusion barrier films. For this embodiment, the device up to this point in the process is formed using conventional methods. Although not illustrated, the interconnects 118 and 112 can be connected to components within the semiconductor device substrate 102 that not are shown in FIG. 1.

Figure 2:
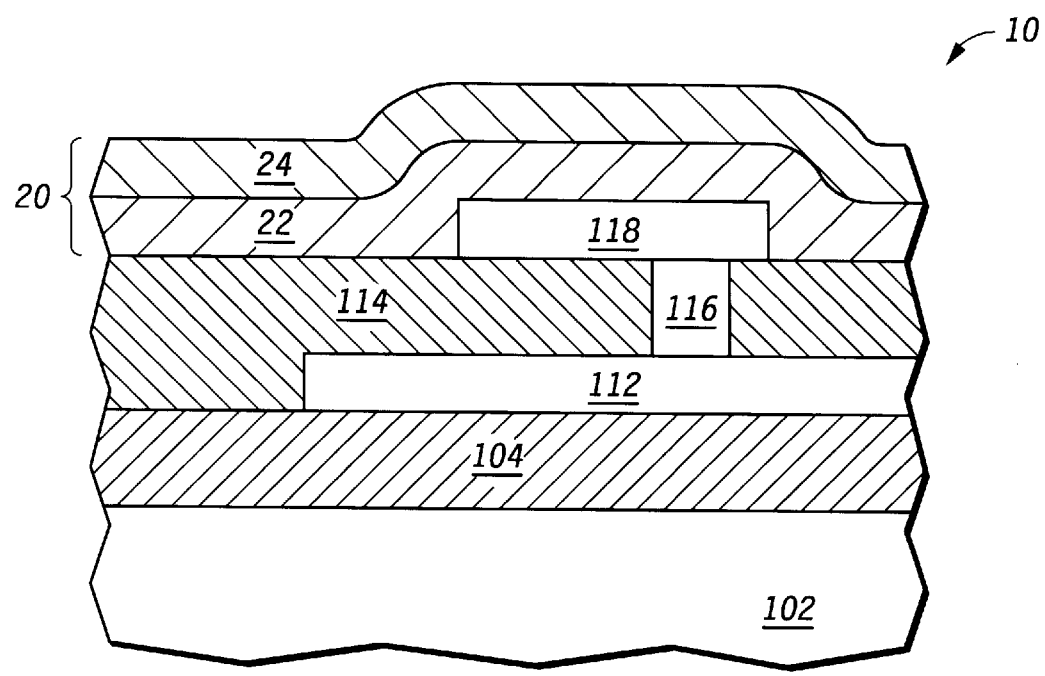
FIG. 2 includes an illustration of a cross-sectional view of the substrate of FIG. 1 after forming a passivation layer in accordance with one embodiment of the present invention.

The semiconductor device substrate 102 is placed into a chemical vapor deposition (CVD) reactor to form a passivation layer 20 over semiconductor device 10 as shown in FIG. 2. The passivation layer 20 includes a doped oxide film 22 approximately 4000 angstroms thick and a nitride film 24 approximately 7000 angstroms thick. In forming the oxide and nitride films 22 and 24, a silicon source gas and an oxygen source gas (for the oxide film 22) and a nitrogen source (for the nitride film) are introduced into the CVD reactor. The silicon source is used that includes fully deuterated silane ($SiD_4$), fully deuterated disilane ($Si_2D_6$), or, in the case of an oxide film, fully deuterated TEOS ($SiO_4C_8D_{20}$). As used in this specification, "fully deuterated" means that all sites that are conventionally occupied by hydrogen atoms are replaced by deuterium atoms. In other embodiments, partially deuterated compounds can be used. Examples of partially deuterated compounds include $SiDH_3$ for silane, $Si_2DH_5$ for disilane, and other partially deuterated compounds could be used for the fully deuterated TEOS. General formulas include $SiD_xH_{4-x}$, where x is one to four; $Si_2D_yH_{6-y}$, where y is one to six; and $SiO_4C_8D_zH_{20-z}$, where z is one to twenty. The deuterated gas concentration of the silicon containing molecules is at least one volume percent. More typically, the deuterated gas concentration of the silicon containing molecules will exceed eighty volume percent.

For an oxide layer, the oxygen sources include nitrous oxide, oxygen, ozone, or the like but do not include hydrogen.

For a doped layer, the dopant gas includes deuterated phosphine (general molecular formula of $PD_xH_{3-x}$), diborane (general molecular formula of $B_2D_yH_{6-y}$), arsine (general molecular formula of $AsD_xH_{3-x}$), trimethyl borate (general molecular formula of $C_3D_zH_{9-z}O_3B_3$) or trimethyl phosphite (general molecular formula of $C_3D_zH_{9-z}O_3P_3$) where x is 1–3, y is 1–6 and z is 1–9. The deuterated gas concentration of the dopant gasses is at least one volume percent. More typically, the deuterated gas concentration of the dopant gasses will exceed eighty volume percent. For a nitride film, a deuterated form of ammonia is used. The general molecular formula for deuterated ammonia is $ND_xH_{3-x}$ where x is 1–3. The deuterated gas concentration of the ammonia molecules is at least one volume percent. More typically, the deuterated gas concentration of the ammonia molecules will exceed eighty volume percent. In the case of the previously described passivation layer, it can be replaced by a single film of doped oxide, plasma enhanced silicon nitride, silicon oxynitride, or a combination of these films. The deposition of the films can be performed using a non-plasma assisted low pressure chemical vapor deposition (LPCVD) or plasma enhanced chemical vapor deposition (PECVD). The parameters for the deposition of these films is expected to be essentially the same as the conventional fully hydrogenated compounds.

Figure 3:
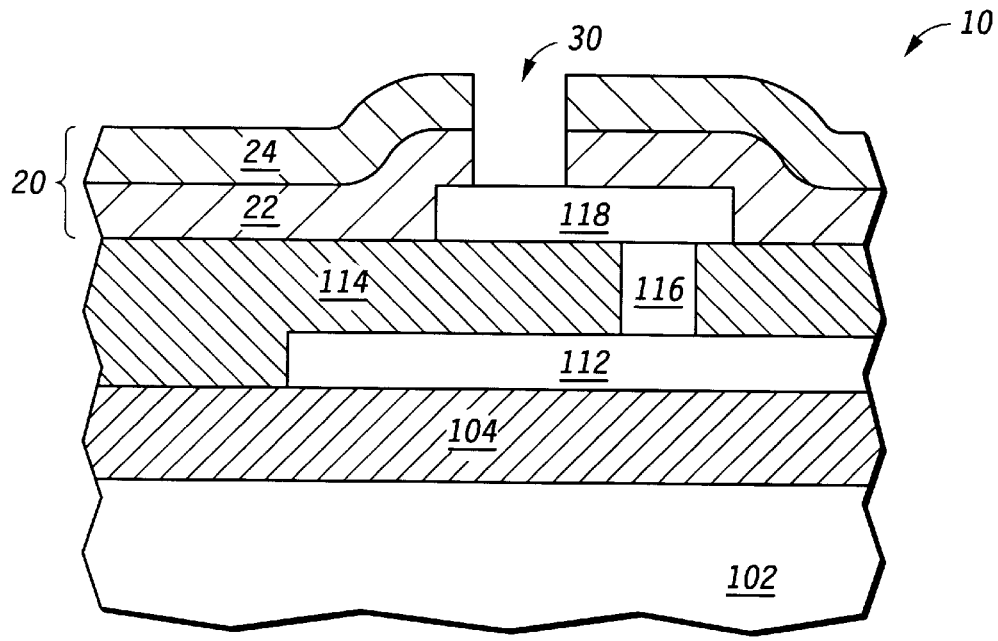
FIG. 3 includes an illustration of a cross-sectional view of the substrate of FIG. 2 after forming a bond pad opening through the passivation layer.

In FIG. 3, a bond pad opening 30 is formed through the passivation layer 20 to expose a portion of the second interconnect layer 118 where a bond pad is formed. The etch chemistry used to etch through the passivation layer 20 is essentially the same as the etch chemistry used to etch a conventional nitride film and a conventional doped oxide film.

Figure 4:
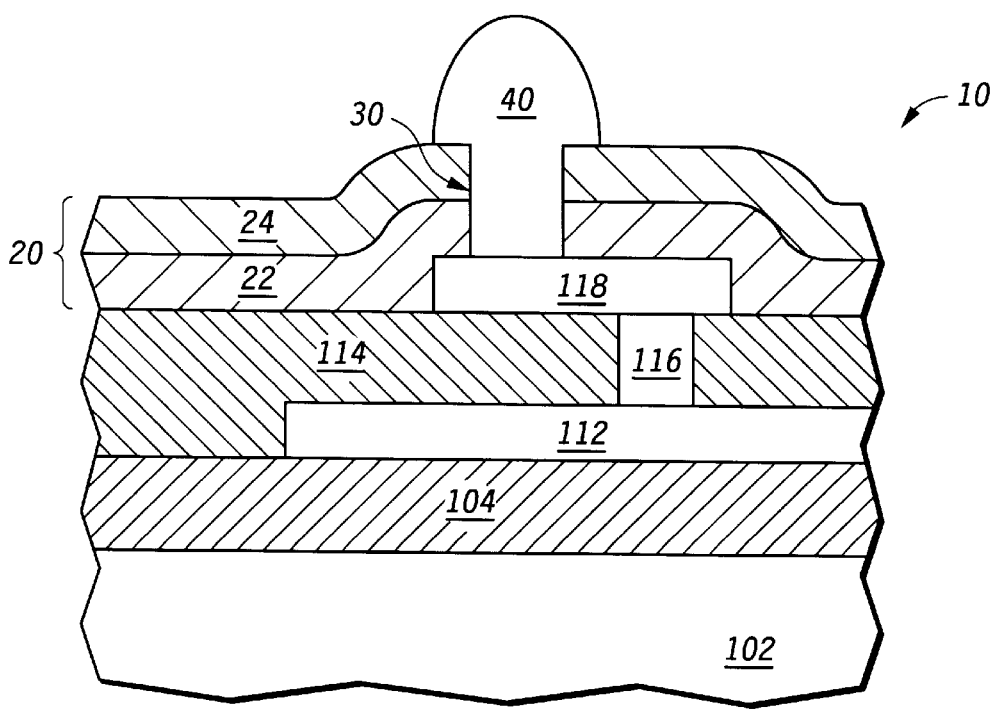
FIG. 4 includes an illustration of a cross-sectional view of the substrate of FIG. 3 after forming a conductive bump within an opening within the passivation layer.

A conductive bump 40 is formed within the bond pad opening 30 as shown in FIG. 4. The conductive bump can include a variety of metallic films but typically includes an alloy that is capable of being soldered at a temperature no higher than approximately 500 degrees Celsius. In one particular embodiment, the conductive bump 40 includes a lead-tin alloy. Other materials may be used in place of or in conjunction with the lead-tin alloy of the conductive bump 40 in FIG. 4.

Other embodiments of the present invention can be used to form other insulating films within the semiconductor device 10. Typically, insulating layers formed using deuterated gases are at least 1000 angstroms thick. More specifically, as shown in FIGS. 1–4, the passivation layer 20 is formed using the deuterated compounds. In other embodiments, the lower interlevel dielectric layers, such as the first insulating layer 104 and the second insulating layer 114 can be formed using the deuterated compounds. Also, other deuterated semiconductor sources including deuterated germane can be used in forming the first and second insulating layers 104 and 114.

In still another embodiment, the sintering process is performed to alloy the first and second interconnect layers 112 and 118. The sintering process can be performed in the same CVD reactor used for forming the passivation layer 20 or a different reactor including a diffusion furnace, an alloying furnace, or a rapid thermal processor. The sintering gas includes DH, molecular deuterium ($D_2$), forming gas including DH or $D_2$ and an inert gas, or the like. Sintering is typically performed at an elevated temperature (higher than room temperature or 25 degrees Celsius), and more specifically in a range of approximately 250–450 degrees Celsius.

In other embodiments, a sintering process can be completely omitted. In either case, the amount of hydrogen being introduced into the device is greatly reduced if a deuterated gas is used or if a sintering process is omitted. If a deuterated gas is used, the deuterium atoms may migrate down to the semiconductor device substrate 102, where they can then passivate interface trap charges that normally form near a gate dielectric/semiconductor device substrate interface. The deuterium atoms are more difficult to remove with hot carriers compared to hydrogen atoms. This allows for better device performance and presumably better long term reliability of the device.

The deuterated insulating films allow better performance of the semiconductor device 10. More specifically, hydrogen content within the insulating films is reduced. The reduction in the hydrogen concentration allows a better performing semiconductor device 10 as a large source of free hydrogen can be removed by using fully deuterated gases. This allows a more predictable threshold voltage for semiconductor devices from substrate to substrate and even run to run.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. In the claims, means-plus-function clause(s), if any, cover the structures described herein that perform the recited function(s) process. The mean-plus-function clause(s) also cover structural equivalents and equivalent structures that perform the recited function(s).

What is claimed is:

1. A process for forming a semiconductor device comprising the steps of:
    forming a metal interconnect over a semiconductor device substrate;
    exposing the semiconductor device substrate to a sintering gas at an elevated temperature within a first reactor, wherein the sintering gas has a first deuterated gas concentration that is at least one volume percent;
    introducing a first source gas and a second source gas into a second reactor, wherein:
        the first reactor and the second reactor are a same CVD reactor;
        the first source gas is a semiconductor source gas having a second deuterated gas concentration that is at least one volume percent;
        the second source gas includes a gas selected from a group consisting of oxygen, ozone, nitrous oxide, and a nitrogen source gas that includes molecules consisting of nitrogen atoms and other atoms having one proton; and
    reacting the first source gas and the second source gas within the second reactor to form an insulating layer over the semiconductor device substrate, wherein the insulating layer is at least 1000 angstroms thick.

2. The process of claim 1, wherein the second deuterated gas concentration is at least eighty volume percent.

3. The process of claim 1, wherein the first deuterated gas concentration is at least eighty volume percent.

4. The process of claim 1, wherein the first source gas is selected from a group consisting of $Si_2D_xH_{6-x}$, x being between one and six and $SiO_4C_8D_yH_{20-y}$, y being between one and twenty.

5. The process of claim 1, wherein the step of introducing also introduces a deuterated dopant gas into the second reactor, wherein the deuterated dopant gas has a third deuterated gas concentration that is at least one volume percent.

6. The process of claim 5, wherein the deuterated dopant gas comprises a gas selected from a group consisting of deuterated phosphine, deuterated diborane, deuterated arsine, deuterated trimethyl borate and deuterated trimethyl phosphite.

7. The process of claim 1, wherein:

the first source gas comprises deuterated silane;

the second source gas comprises deuterated ammonia and nitrous oxide; and the insulating layer includes silicon oxynitride.

8. The process of claim 1, wherein the sintering gas comprises DH or $D_2$.

9. A process for forming a semiconductor device comprising the steps of:

forming a metal interconnect over a semiconductor device substrate; and forming a silicon nitride layer over the metal interconnect, wherein this step includes steps of:

introducing a first silicon source gas and a nitrogen source gas into a first reactor having the semiconductor device substrate wherein the first silicon source gas has a first deuterated gas concentration that is at least one volume percent; and reacting the first silicon source gas and the nitrogen source gas within the first reactor to deposit the silicon nitride layer.

10. The process of claim 9, further comprising the step of exposing the semiconductor device substrate to a sintering gas at an elevated temperature, wherein the sintering gas has a second deuterated gas concentration that is at least one volume percent.

11. The process of claim 10, wherein the sintering gas has a second deuterated gas concentration that is at least eighty volume percent.

12. The process of claim 10, wherein the sintering gas comprises a gas selected from the group consisting of DH or $D_2$.

13. The process of claim 9, wherein:

the nitrogen source gas has a second deuterated gas concentration that is at least one volume percent.

14. The process of claim 9, wherein:

the first silicon source gas has a first deuterated gas concentration that is at least eighty volume percent; and the nitrogen source gas has a third deuterated gas concentration that is at least eighty volume percent.

15. The process of claim 9, wherein the first silicon source gas has a deuterated gas concentration that is at least eighty volume percent.

16. The process of claim 9 further comprising:

forming an oxide layer over the metal interconnect prior to forming the silicon nitride layer, wherein his step includes steps of:

introducing a second silicon source gas and an oxygen source gas into a second reactor having the semiconductor device substrate, wherein the second silicon source gas has a second deuterated gas concentration that is at least one volume percent;

reacting the second silicon source gas and the oxygen source gas within the second reactor to deposit the oxide layer to a thickness of at least 1000 angstroms.

17. The process of claim 16 wherein the first reactor and the second reactor is a same reactor.

18. The process of claim 16, wherein the second silicon source gas has a deuterated gas concentration that is at least eighty volume percent.

* * * * *